(12) United States Patent
Kong et al.

(10) Patent No.: US 9,601,338 B2
(45) Date of Patent: Mar. 21, 2017

(54) THIN FILM TRANSISTOR AND MANUFACTURING METHOD THEREOF, ARRAY SUBSTRATE AND MANUFACTURING METHOD THEREOF, AND DISPLAY DEVICE

(71) Applicant: BOE TECHNOLOGY GROUP CO., LTD., Beijing (CN)

(72) Inventors: Xiangyong Kong, Beijing (CN); Hongda Sun, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 14/429,279

(22) PCT Filed: Jul. 31, 2014

(86) PCT No.: PCT/CN2014/083429
§ 371 (c)(1),
(2) Date: Mar. 18, 2015

(87) PCT Pub. No.: WO2015/109811
PCT Pub. Date: Jul. 30, 2015

(65) Prior Publication Data
US 2016/0013060 A1    Jan. 14, 2016

(30) Foreign Application Priority Data
Jan. 27, 2014 (CN) .......................... 2014 1 0039812

(51) Int. Cl.
*H01L 21/02* (2006.01)
*H01L 21/283* (2006.01)
(Continued)

(52) U.S. Cl.
CPC ...... *H01L 21/283* (2013.01); *H01L 21/31144* (2013.01); *H01L 21/77* (2013.01);
(Continued)

(58) Field of Classification Search
CPC .............................. H01L 23/53214–23/53223
See application file for complete search history.

(56) References Cited

U.S. PATENT DOCUMENTS 5,969,386 A * 10/1999 Hong ................ H01L 21/28008
257/347
6,252,247 B1 * 6/2001 Sakata .............. H01L 29/41733
257/383
(Continued)

FOREIGN PATENT DOCUMENTS

CN          1530726 A      9/2004
CN          1812109 A      8/2006
(Continued)

OTHER PUBLICATIONS

Nov. 4, 2014 (CN) International Search Report for PCT/CN2014/083429.
(Continued)

*Primary Examiner* — Eric Ward
(74) *Attorney, Agent, or Firm* — Banner & Witcoff, Ltd.

(57) ABSTRACT

A thin film transistor and a manufacturing method thereof, an array substrate and a manufacturing method thereof, and a display device are provided. The array substrate comprises: a base substrate and an electrode arranged on the base substrate. The electrode comprises: an aluminum layer or an aluminum alloy layer on the base substrate; and a first barrier layer arranged on the aluminum layer or the aluminum alloy layer and configured for preventing the aluminum layer or the aluminum alloy layer from producing hillocks. The array substrate can eliminate bad phenomenon that the metal aluminum or aluminum alloy formed on the base substrate produces hillocks when subjected to high temperature.

16 Claims, 2 Drawing Sheets

(51) Int. Cl.
  H01L 27/12     (2006.01)
  H01L 21/77     (2006.01)
  H01L 29/45     (2006.01)
  H01L 29/49     (2006.01)
  H01L 21/311    (2006.01)
  H01L 27/32     (2006.01)
  H01L 29/417    (2006.01)
  H01L 29/423    (2006.01)
  H01L 29/51     (2006.01)
  H01L 29/66     (2006.01)
  H01L 29/786    (2006.01)
  G02F 1/1362    (2006.01)

(52) U.S. Cl.
  CPC ........ *H01L 27/124* (2013.01); *H01L 27/1237* (2013.01); *H01L 27/1259* (2013.01); *H01L 27/3244* (2013.01); *H01L 29/41733* (2013.01); *H01L 29/42384* (2013.01); *H01L 29/45* (2013.01); *H01L 29/4908* (2013.01); *H01L 29/513* (2013.01); *H01L 29/517* (2013.01); *H01L 29/518* (2013.01); *H01L 29/66742* (2013.01); *H01L 29/786* (2013.01); *G02F 2001/136295* (2013.01)

(56) References Cited

U.S. PATENT DOCUMENTS

| | | | | |
|---|---|---|---|---|
| 6,534,349 B1 * | 3/2003 | Kubota | ................. | H01L 27/124 257/E21.582 |
| 7,235,310 B2 * | 6/2007 | Chang | ................... | B32B 15/016 257/750 |
| 7,400,365 B2 * | 7/2008 | Gotoh | ................... | G02F 1/1368 257/59 |
| 7,795,690 B2 * | 9/2010 | Misaki | ....................... | C23F 1/16 257/257 |
| 7,951,713 B2 * | 5/2011 | Kim | ................... | H01L 21/76834 438/683 |
| 2008/0073788 A1 * | 3/2008 | Jeon | .................... | H01L 21/7685 257/751 |
| 2008/0254613 A1 * | 10/2008 | Li | ....................... | H01L 21/2855 438/624 |

FOREIGN PATENT DOCUMENTS

| | | |
|---|---|---|
| CN | 1917218 A | 2/2007 |
| CN | 103779358 A | 5/2014 |

OTHER PUBLICATIONS

Nov. 4, 2014 (CN) Written Opinion for PCT/CN2014/083429—Eng Tran.
Nov. 9, 2015—(CN)—First Office Action Appn 201410039812.7 with English Tran.
Mar. 9, 2016—(CN)—Second Office Action Appn 201410039812.7 with English Tran.
Jul. 29, 2016—(CN)—Third Office Action Appn . 201410039812.7 with English Tran.

* cited by examiner

THIN FILM TRANSISTOR AND MANUFACTURING METHOD THEREOF, ARRAY SUBSTRATE AND MANUFACTURING METHOD THEREOF, AND DISPLAY DEVICE

The application is a U.S. National Phase Entry of International Application No. PCT/CN2014/083429 filed on Jul. 31, 2014, designating the United States of America and claiming priority to Chinese Patent Application No. 201410039812.7 filed on Jan. 27, 2014. The present application claims priority to and the benefit of the above-identified applications and the above-identified applications are incorporated by reference herein in their entirety.

TECHNICAL FIELD

At least one embodiment of the present disclosure relates to a thin film transistor and a manufacturing method thereof, an array substrate and a manufacturing method thereof, and a display device.

BACKGROUND

In the field of flat-panel display technology, flat-panel display devices having large size, high resolution and high picture quality, such as liquid crystal televisions, have occupied predominance in the current flat-panel display market.

A display panel includes various electrodes and there are many materials for manufacturing electrode. For example, in order to avoid signal delay, electrodes such as source electrode, drain electrode, gate electrode and gate lines, data lines and common electrode are made of metal copper (Cu) with small resistance, so as to reduce delay of image signals.

In current display panels, such as liquid crystal display (LCD) panel and organic light-emitting diode (OLED) display panels, electrode are generally made of metal aluminum (Al) having low cost, high electrical conductivity and very small metal ion diffusibility.

SUMMARY

At least one embodiment of the present disclosure provides a thin film transistor and a manufacturing method thereof, an array substrate and a manufacturing method thereof, and a display device, so as to eliminate the bad phenomenon that metallic aluminum or aluminum alloy formed on the base substrate produces hillocks when encounters high temperature.

At least one embodiment of the present disclosure provides a thin film transistor including a base substrate and an electrode arranged on the base substrate. The electrode includes: an aluminum layer or aluminum alloy layer arranged on the base substrate; and a first barrier layer arranged on the aluminum layer or aluminum alloy layer and configured for preventing the aluminum layer or aluminum alloy layer from producing hillocks.

At least one embodiment of the present disclosure provides an array substrate including a base substrate and an electrode arranged on the base substrate. The electrode includes: an aluminum layer or aluminum alloy layer arranged on the base substrate; and a first barrier layer arranged on the aluminum layer or aluminum alloy layer and configured for preventing the aluminum layer or aluminum alloy layer from producing hillocks.

At least one embodiment of the present disclosure further provides a manufacturing method of an array substrate, and the method comprises: forming an aluminum layer or aluminum alloy layer on a base substrate; forming a first barrier layer, configured for preventing the aluminum layer or aluminum alloy layer from producing hillocks, on the aluminum layer or aluminum alloy layer; and patterning the aluminum layer or aluminum alloy layer and the first barrier layer according to an electrode pattern to be formed, to form the electrode pattern correspondingly.

At least one embodiment of the present disclosure further provides a display device including the above-mentioned thin film transistor or the array substrate.

At least one embodiment of the present disclosure further provides a manufacturing method of a thin film transistor, and the method includes: forming an aluminum layer or aluminum alloy layer on a base substrate; forming a first barrier layer, configured for preventing the aluminum layer or aluminum alloy layer from producing hillocks, on the aluminum layer or aluminum alloy layer; and patterning the aluminum layer or aluminum alloy layer and the first barrier layer according to an electrode pattern to be formed, to form the electrode pattern correspondingly.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

The inventor of the present application noted that, in an array substrate, pure aluminum deposited on a substrate tends to produce hillocks on its surface when subjected to high temperature (for example, 300° C.) (namely hillock phenomenon). The reason why this phenomenon is generated is that a heated substrate (typically, a glass substrate) has different thermal expansion coefficient from the aluminum layer. A side of the aluminum layer, close to the substrate, is restricted for expansion, and a side of the aluminum layer, away from the substrate expands to produce hillocks.

At least one embodiment of the present disclosure provides a thin film transistor and a manufacturing method thereof, an array substrate and a manufacturing method thereof, and a display device, so as to eliminate the bad phenomenon that metallic aluminum or aluminum alloy produces hillocks when encounters high temperature after being formed on the base substrate.

The array substrate and the manufacturing method thereof, and the display device provided by embodiments of the present disclosure will be described in detail below with respect to the accompanying drawings.

Figure 1:
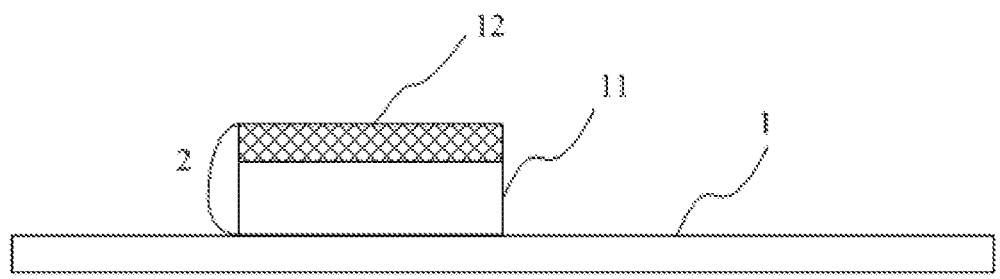
FIG. 1 is a schematic view illustrating a first structure of an array substrate provided in an embodiment of the present disclosure.

FIG. 1 is a cross sectional diagram of an array substrate provided by an embodiment of the present disclosure, and the array substrate includes: a base substrate 1 and an electrode 2 arranged on the base substrate 1. The electrode 2 includes: an aluminum layer or an aluminum alloy layer 11 arranged on the base substrate 1; and a first barrier layer 12 arranged on the aluminum layer or the aluminum alloy layer 11 and configured for preventing the aluminum layer or the aluminum alloy layer 11 from producing hillocks. For example, the first barrier layer 12 comprises an aluminum nitride layer.

The material for the base substrate 1 is not limited, for example, the base substrate 1 is a glass substrate.

The electrode 2 can include at least one selected from the group consisting of a gate electrode, a source electrode, a drain electrode, a gate line and a data line which are provided on the base substrate, a cathode and an anode in an organic light-emitting device (OLED), and various electrode leads in periphery regions. Other electrodes will not be listed individually herein. Any structure made of an aluminum layer or aluminum alloy layer on the base substrate 1 is applicable to embodiments of the present disclosure.

Generally, an aluminum layer or an aluminum alloy layer 11 has a large expansion coefficient when heated under high temperature, and tends to deform without the action of other barrier layer. As the temperature increases, it tends to produce elastic deformation. For example, an aluminum layer or an aluminum alloy layer 11 arrives at its limit of bearing interior compressive stress under a ultimate temperature of about 130° C., releases the compressive stress through atomic diffusion, and produces hillocks on the surface of aluminum layer or aluminum alloy layer 11.

In embodiments of the present disclosure, a first barrier layer 12 is provided on the aluminum layer or the aluminum alloy layer 11 on the base substrate 1, the first barrier layer 12 is, for example, an aluminum nitride layer, which has small expansion coefficient and good attachment to the base substrate, cannot deform in high temperature environment, and therefore can prevent the aluminum layer or aluminum alloy layer 11 from producing hillocks.

In addition, that the first barrier layer 12 comprises an aluminum nitride layer can not only avoid hillock phenomenon produced on the surface of aluminum layer or aluminum alloy layer 11, but also has an insulation function to protect the surface of the electrode. During manufacturing the electrode, the insulating layer on the electrode is manufactured, and this simplifies the process flow of manufacturing the electrode and the insulating layer.

Although the probability that the aluminum layer or aluminum alloy layer 11 produces hillocks on the side close to the base substrate 1 under the action of base substrate 1 is small, aluminum layer or aluminum alloy layer 11 manufactured on a base substrate made of different materials can also produce hillocks to various degrees under the action of high temperature.

Figure 2:
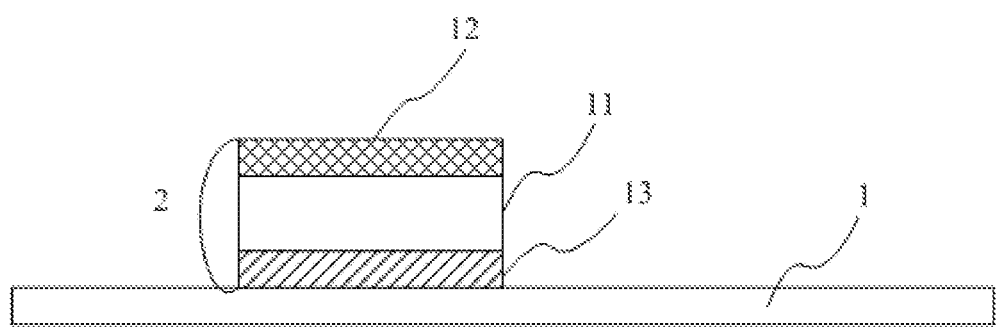
FIG. 2 is a schematic view illustrating a second structure of an array substrate provided in an embodiment of the present disclosure.

In order to further prevent the aluminum layer or aluminum alloy layer 11 from producing hillocks, referring to FIG. 2, on the basis of the array substrate shown in FIG. 1, the electrode 2 can further include a second barrier layer 13 arranged between the base substrate 1 and the aluminum layer or aluminum alloy layer 11 and configured for preventing the aluminum layer or aluminum alloy layer 11 from producing hillocks. In one embodiment, the second barrier layer 13 can include a conducting layer doped with nitrogen ions, for example, an aluminum composite layer doped with nitrogen ions.

In the array substrate shown in FIG. 2 provided in the embodiment of the present disclosure, barrier layers are provided on both sides of the aluminum layer or aluminum alloy layer 11, namely the first barrier layer 12 and the second barrier layer 13 respectively. The second barrier layer 13 also has a small expansion coefficient, cannot deform in high temperature environment, and therefore can prevent the aluminum layer or aluminum alloy layer 11 from producing hillocks. The aluminum layer or aluminum alloy layer 11 is sandwiched between the first barrier layer 12 and the second barrier layer 13. In a high temperature environment, the aluminum layer or aluminum alloy layer 11 is not likely to deform, and this further avoids the bad phenomenon that the aluminum layer or aluminum alloy layer 11 produces hillocks under the action of high temperature.

Figure 3:
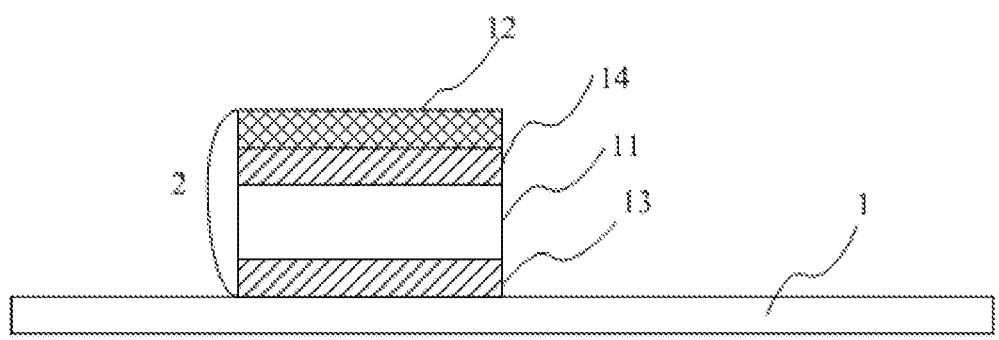
FIG. 3 is a schematic view illustrating a third structure of an array substrate provided in an embodiment of the present disclosure.

In order to further prevent the aluminum layer or aluminum alloy layer 11 from producing hillocks, referring to FIG. 3, on the basis of the array substrate shown in FIG. 2, the electrode 2 can further include a third barrier layer 14 arranged between the first barrier layer 12 and the aluminum layer or aluminum alloy layer 11 and configured for preventing the aluminum layer or aluminum alloy layer 11 from producing hillocks. It is to be noted that, the array substrate provided in at least one embodiment of the present disclosure can further include a third barrier layer 14 on the basis of the array substrate described in FIG. 1. That is, in this case, the array substrate can include a first barrier layer 12 and a third barrier layer 14, but not include the second barrier layer 13.

In one embodiment, the third barrier layer 14 can include an aluminum composite layer doped with nitrogen ions. The aluminum composite layer can conduct electricity, and this can not only avoid the hillock phenomenon on the surface of the aluminum layer or aluminum alloy layer, but also contribute to the conductivity of the electrode to a certain degree.

In one embodiment, when the second barrier layer 13 and the third barrier layer 14 have the same material and the same thermal expansion coefficient, the aluminum layer or aluminum alloy layer 11 is subjected to the same resistance action on both sides, and thereby is unlikely to deform and produce hillocks.

That the first barrier layer 12 comprises an aluminum nitride layer can not only avoid the hillock phenomenon on the surface of metallic aluminum layer or aluminum alloy layer 11, but also have an insulation function to protect the surface of the electrode. During manufacturing the electrode, the insulating layer on the electrode is manufactured, and this simplifies the process flow of manufacturing the electrode and the insulating layer. Furthermore, the aluminum nitride insulating layer and the aluminum composite layer doped with nitrogen ions have the same element, which endows them with sound bonding force. In manufacturing electrodes similar to the gate electrode, the source electrode and the drain electrode in a thin film transistor and the insulating layer thereon, adopting the electrode structure described in the embodiments of the present disclosure can realize a better effect.

In addition, each of the array substrate structure shown in FIGS. 1 to 3 provided in embodiments of the present disclosure is only an example. In implementations, materials for the first barrier layer 12 and the second barrier layer 13 can be any material that can have the function of preventing the aluminum layer or aluminum alloy layer 11 from deforming in a high temperature environment. For example, materials for the respective barrier layers can be high-temperature resistant materials such as boride, carbide, nitride, silicide, phosphide and sulfide of metals such as molybdenum, chromium, titanium, aluminum etc., or can be materials with small thermal expansion coefficients such as boron carbide, silicon carbide, boron nitride, silicon nitride, boron phosphide and silicon phosphide. In various embodiments, at least two selected from the group consisting of the barrier layers and the aluminum layer or the aluminum alloy layer can include a same element. Thus, better bonding forces between barrier layers and between the barrier layer and the aluminum layer or aluminum alloy layer can be achieved, and it is more advantageous for simplifying the process flow of manufacturing the aluminum layer or aluminum alloy layer and the barrier layers.

The electrode 2 provided in at least one embodiment of the present disclosure can be any electrode suitable to be made of aluminum or aluminum alloy, and can include, for example, at least one selected from the group consisting of a gate electrode, a source electrode and a drain electrode on the array substrate, and/or can also comprise at least one selected from the group consisting of a gate line, a data line, a gate lead and a source lead. Other electrodes will not be listed individually herein.

The array substrate according to embodiments of the present disclosure can be applicable to display devices such as liquid crystal display devices, OLED display devices and electronic paper display devices.

A manufacturing method of an array substrate provided in at least one embodiment of the present disclosure will be described below with respect to the array substrate shown in FIGS. 1 to 3 as an example.

In one embodiment, the manufacturing method of the array substrate generally includes: forming an aluminum layer or aluminum alloy layer 11 covering the entire base substrate 1 on the base substrate 1; forming a first barrier layer 12, configured for preventing the aluminum layer or aluminum alloy layer 11 from producing hillocks, on the aluminum layer or aluminum alloy layer 11; and patterning the aluminum layer or aluminum alloy layer 11 and the first barrier layer 12 according to an electrode pattern to be formed, to form the electrode pattern correspondingly. For example, the first barrier layer can be an aluminum nitride layer.

Therefore, in the obtained electrode pattern, the aluminum layer or aluminum alloy layer 11 and the first barrier layer 12 have sectional dimensions with the same width, as shown in FIG. 1.

In various embodiments, the electrode pattern can include at least one selected from the group consisting of a gate electrode pattern, a source electrode pattern, a drain electrode pattern, a gate line pattern, a data line pattern, a cathode pattern, an anode pattern and a electrode lead pattern, which are arranged on the base substrate 1.

With regard to the array substrate shown in FIG. 2, on the basis of the above-mentioned steps, in one embodiment, the method can further comprise: before forming the aluminum layer or aluminum alloy layer 11, forming a second barrier layer 13, configured for preventing the aluminum layer or aluminum alloy layer 11 from producing hillocks, on the base substrate 1; and at the same time of patterning the aluminum layer or aluminum alloy layer 11 and the first barrier layer 12 according to the electrode pattern to be formed, the method can include: patterning the second barrier layer 13 according to the electrode pattern.

Therefore, in the obtained electrode pattern, the aluminum layer or aluminum alloy layer 11, the first barrier layer 12 and the second barrier layer 13 have sectional dimensions with the same width, as shown in FIG. 2.

With regard to the array substrate shown in FIG. 3, on the basis of the above-mentioned steps, in one embodiment, the method can further include: before forming the first barrier layer 12, forming a third barrier layer 14 on the aluminum layer or aluminum alloy layer 11; and at the same time of patterning the aluminum layer or aluminum alloy layer 11, the first barrier layer 12 and the second barrier layer 13 according to the electrode pattern to be formed, the method can further include: patterning the third barrier layer 14 according to the electrode pattern.

Therefore, in the obtained electrode pattern, the aluminum layer or aluminum alloy layer 11, the first barrier layer 12, the second barrier layer 13 and the third barrier layer 14 have sectional dimensions with the same width, as shown in FIG. 3.

In one embodiment, before forming the second barrier layer 13, the aluminum layer or aluminum alloy layer 11, the third barrier layer 14 and the first barrier layer 12, the target in a film formation chamber can be provided as aluminum or aluminum alloy; and nitrogen gas and argon gas (namely $N_2$ and Ar) can be introduced into the film formation chamber before film formation with the argon gas Ar as a protection gas and the nitrogen gas $N_2$ as a reacting gas. Forming the second barrier layer 13, the aluminum layer or aluminum alloy layer 11, the third barrier layer 14 and the first barrier layer 12 can include: varying the flow rate percentage of nitrogen gas according to the type of the film to be formed, with the total flow rate of nitrogen gas and argon gas of 100%. The second barrier layer 13, the aluminum layer or aluminum alloy layer 11, the third barrier layer 14 and the first barrier layer 12 can be formed in turn in a sputter method in the film formation chamber.

In one embodiment, forming the second barrier layer 13, the aluminum layer or aluminum alloy layer 11, the third barrier layer 14 and the first barrier layer 12 can include: with metallic aluminum or aluminum alloy as a target in the film formation chamber, sputtering the target to form the second barrier layer 13, the aluminum layer or aluminum alloy layer 11, the third barrier layer 14 and the first barrier layer 12 in turn on the base substrate 1. In this process, in the period of forming the second barrier layer 13, nitrogen gas and argon gas of a first predetermined proportion are introduced; in the period of forming the aluminum layer or aluminum alloy layer 11, argon gas is introduced; in the period of forming the third barrier layer 14, nitrogen gas and argon gas of a third predetermined proportion are introduced; and in the period of forming the first barrier layer 12, nitrogen gas and argon gas of a second predetermined proportion are introduced.

For example, the nitrogen gas of the first predetermined proportion has a flow rate percentage of 1%~6%, and the formed second barrier layer 13 includes an aluminum composite layer doped with nitrogen ions.

For example, the nitrogen gas of the third predetermined proportion has a flow rate percentage of 1%~6%, and the formed third barrier layer 14 includes an aluminum composite layer doped with nitrogen ions.

For example, the nitrogen gas of the second predetermined proportion has a flow rate percentage of 6%~60%, and the formed first barrier layer 12 is an aluminum nitride layer.

The above-mentioned conditions related to the first to third predetermined proportions can be combined arbitrarily to obtain the electrode patterns of embodiments shown in FIGS. 1-3.

In the manufacturing method of the array substrate provided in the above embodiment of the present disclosure, a plurality of layers formed with different materials are completed in one and the same film formation process, the types of the formed layers are controlled only by controlling the flow ratio of nitrogen gas and argon gas, and the film thicknesses are controlled by controlling the introduction durations of nitrogen gas and argon gas. This simplifies the process of manufacturing the electrode and increases the efficiency of manufacturing the electrode. In the manufacturing method of the array substrate provided in at least one embodiment of the present disclosure, the aluminum layer or aluminum alloy layer and respective barrier layers include the same element, aluminum, and barrier layers have the same elements, nitrogen and aluminum. Because at least two selected from the group consisting of the barrier layers and the aluminum layer or aluminum alloy layer can include a same element, better bonding forces between the barrier layers and between a barrier layer and the aluminum layer or aluminum alloy layer can be achieved, and it is more advantageous for simplifying the process flow of manufacturing the aluminum layer or aluminum alloy layer and the barrier layers.

Furthermore, any other electrodes on the array substrate, such as touch driving electrodes and touch sensing electrodes, can all adopt the electrode structure provided in the above-mentioned embodiments of the present disclosure. Other electrodes are not listed individually herein.

At least one embodiment of the present disclosure further provides a thin film transistor including a base substrate and an electrode arranged on the base substrate. The electrode includes: an aluminum layer or aluminum alloy layer disposed on the base substrate; and a first barrier layer, configured for preventing the aluminum layer or aluminum alloy layer from producing hillocks and disposed on the aluminum layer or the aluminum alloy layer. For example, the first barrier layer comprises an aluminum nitride layer.

In one embodiment, the electrode can further include: a second barrier layer configured for preventing the aluminum layer or aluminum alloy layer from producing hillocks and disposed between the base substrate and the aluminum layer or aluminum alloy layer. For example, the second barrier layer can comprise an aluminum composite layer doped with nitrogen ions.

In one embodiment, the electrode can further include: a third barrier layer disposed between the aluminum layer or aluminum alloy layer and the first barrier layer. For example, the third barrier layer can comprise an aluminum composite layer doped with nitrogen ions.

In various embodiments, the electrode can include at least one selected from the group consisting of a gate electrode, a source electrode, a drain electrode and an electrode lead which are disposed on the base substrate.

In various embodiments, at least two selected from the group consisting of the aluminum layer or aluminum alloy layer, and the first barrier layer, the second barrier layer and the third barrier layer can comprise a same element.

With regard to the structures such as aluminum layer or aluminum alloy layer and respective barrier layers in the thin film transistor provided in any one of the above-mentioned embodiments, the related description of the above array substrate can be referred to for detail, which is omitted herein.

At least one embodiment of the present disclosure further provides a manufacturing method of a thin film transistor, and the method includes: forming an aluminum layer or an aluminum alloy layer on a base substrate; forming a first barrier layer, configured for preventing the aluminum layer or the aluminum alloy layer from producing hillocks, on the aluminum layer or aluminum alloy layer; and patterning the aluminum layer or the aluminum alloy layer and the first barrier layer according to an electrode pattern to be formed, to form the electrode pattern correspondingly. For example, the first barrier layer comprises an aluminum nitride layer.

In one embodiment, the method can further include: before forming the aluminum layer or the aluminum alloy layer, forming a second barrier layer, configured for preventing the aluminum layer or aluminum alloy layer from producing hillocks, on the base substrate; and at the same time of patterning the aluminum layer or aluminum alloy layer and the first barrier layer according to the electrode pattern to be formed, the method further includes: patterning the second barrier layer according to the electrode pattern.

In one embodiment, the method can further include: before forming the first barrier layer, forming a third barrier layer on the aluminum layer or aluminum alloy layer; and at the same time of patterning the aluminum layer or aluminum alloy layer, the first barrier layer and the second barrier layer according to the electrode pattern, the method further includes: patterning the third barrier layer according to the electrode pattern.

In one embodiment, during forming the second barrier layer, the aluminum layer or aluminum alloy layer, the third barrier layer and the first barrier layer, with a metal that the aluminum layer or aluminum alloy layer comprises as a target in the film formation chamber, the target is sputtered, to form the second barrier layer, the aluminum layer or aluminum alloy layer, the third barrier layer and the first barrier layer in turn on the base substrate. For example, in the period of forming the second barrier layer, nitrogen gas and argon gas of a first predetermined proportion are introduced; in the period of forming the aluminum layer or aluminum alloy layer, argon gas is introduced; in the period of forming the third barrier layer, nitrogen gas and argon gas of a third predetermined proportion are introduced; and in the period of forming the first barrier layer, nitrogen gas and argon gas of a second predetermined proportion are introduced.

For example, the nitrogen gas of the first predetermined proportion has a flow rate percentage of 1%~6%, and the formed second barrier layer comprises an aluminum composite layer doped with nitrogen ions.

For example, the nitrogen gas of the third predetermined proportion has a flow rate percentage of 1%~6%, and the formed third barrier layer comprises an aluminum composite layer doped with nitrogen ions.

For example, the nitrogen gas of the second predetermined proportion has a flow rate percentage of 6%~60% and the formed first barrier layer is an aluminum nitride layer.

In various embodiments, the electrode pattern can include at least one selected from the group consisting of a gate electrode, a source electrode, a drain electrode and an electrode lead which are disposed on the base substrate.

In various embodiments, at least two selected from the group consisting of the aluminum layer or aluminum alloy layer, and the first barrier layer, the second barrier layer and the third barrier layer can include a same element.

With regard to the manufacturing method of the thin film transistor provided in any one of the above-mentioned embodiments, related description in the above-mentioned manufacturing method of the array substrate can be referred to, which will omitted herein.

At least one embodiment of the present disclosure further provides a display device including the above-mentioned thin film transistor or array substrate. The display device can be a display device such as a liquid crystal panel, a liquid crystal display, a liquid crystal television, an organic light-emitting display (OLED) panel, an OLED display, an OLED television or an electronic paper.

It is apparent to those skilled in the art to make various modifications and variations to the present invention without departing from the spirit and scope of the present invention. In this way, if these modifications and variations belong to the scope of the claims of the present invention and their equivalents, then the present invention is intended to cover these modifications and variations.

The present application claims the benefit of China Patent Application No. 201410039812.7, filed on Jan. 27, 2014, which is hereby entirely incorporated by reference as a part of the present application.

What is claimed is:

1. A thin film transistor, comprising a base substrate and an electrode arranged on the base substrate, wherein the electrode comprises:
    an aluminum layer or an aluminum alloy layer, arranged on the base substrate;
    a first barrier layer, arranged on the aluminum layer or the aluminum alloy layer, and configured for preventing the aluminum layer or the aluminum alloy layer from producing hillocks;
    a second barrier layer arranged between the base substrate and the aluminum layer or the aluminum alloy layer and configured for preventing the aluminum layer or the aluminum alloy layer from producing hillocks, wherein the second barrier layer comprises an aluminum composite layer doped with nitrogen ions which conducts electricity; and
    a third barrier layer arranged between the aluminum layer or the aluminum alloy layer and the first barrier layer, wherein the third barrier layer and the first barrier layer comprise a same element aluminum.

2. The thin film transistor according to claim 1, wherein the first barrier layer comprises an aluminum nitride layer.

3. The thin film transistor according to claim 1, wherein the third barrier layer comprises an aluminum composite layer doped with nitrogen ions.

4. The thin film transistor according to claim 1, wherein the electrode comprises at least one selected from the group consisting of a gate electrode, a source electrode, a drain electrode and an electrode lead, which are arranged on the base substrate.

5. The thin film transistor according to claim 1, wherein at least two selected from the group consisting of the aluminum layer or the aluminum alloy layer, and the first barrier layer, the second barrier layer and the third barrier layer, comprise a same element.

6. A display device, comprising the thin film transistor according to claim 1.

7. The thin film transistor according to claim 1, wherein the third barrier layer and the first barrier layer have same elements, nitrogen and aluminum.

8. An array substrate, comprising a base substrate and an electrode arranged on the base substrate, wherein the electrode comprises:
    an aluminum layer or an aluminum alloy layer, arranged on the base substrate;
    a first barrier layer, arranged on the aluminum layer or the aluminum alloy layer, and configured for preventing the aluminum layer or the aluminum alloy layer from producing hillocks;
    a second barrier layer arranged between the base substrate and the aluminum layer or the aluminum alloy layer and configured for preventing the aluminum layer or the aluminum alloy layer from producing hillocks, wherein the second barrier layer comprises an aluminum composite layer doped with nitrogen ions which conducts electricity; and
    a third barrier layer arranged between the aluminum layer or the aluminum alloy layer and the first barrier layer, wherein the third barrier layer and the first barrier layer comprise a same element aluminum.

9. The array substrate according to claim 8, wherein the first barrier layer comprises an aluminum nitride layer.

10. The array substrate according to claim 8, wherein the third barrier layer comprises an aluminum composite layer doped with nitrogen ions.

11. The array substrate according to claim 8, wherein the electrode comprises at least one selected from the group consisting of a gate electrode, a source electrode, a drain electrode, a gate line, a data line, a cathode, an anode, an electrode lead, a touch driving electrode and a touch sensing electrode, which are arranged on the base substrate.

12. The array substrate according to claim 8, wherein at least two selected from the group consisting of the aluminum layer or the aluminum alloy layer, and the first barrier layer, the second barrier layer and the third barrier layer, comprise a same element.

13. A manufacturing method of an array substrate, comprising:
    forming an aluminum layer or an aluminum alloy layer on a base substrate;
    forming a first barrier layer, configured for preventing the aluminum layer or the aluminum alloy layer from producing hillocks, on the aluminum layer or the aluminum alloy layer;
    patterning the aluminum layer or the aluminum alloy layer and the first barrier layer according to an electrode pattern to be formed, to form the electrode pattern correspondingly; and
    before forming the aluminum layer or the aluminum alloy layer, forming a second barrier layer, configured for preventing the aluminum layer or the aluminum alloy layer from producing hillocks, on the base substrate, wherein the second barrier layer comprises an aluminum composite layer doped with nitrogen ions which conducts electricity,
    wherein before forming the first barrier layer, a third barrier layer is formed on the aluminum layer or the aluminum alloy layer, and the third barrier layer and the first barrier layer comprise a same element aluminum.

14. The method according to claim 13, wherein patterning the aluminum layer or the aluminum alloy layer and the first barrier layer according to the electrode pattern to be formed, comprises simultaneously patterning the second barrier layer according to the electrode pattern.

15. The method according to claim 14,
wherein patterning the aluminum layer or the aluminum alloy layer, and the first barrier layer and the second barrier layer according to the electrode pattern comprises simultaneously patterning the third barrier layer according to the electrode pattern.

16. The method according to claim 15, wherein
with metal aluminum as a target in a film formation chamber, the target is sputtered to form the second barrier layer, the aluminum layer or the aluminum alloy layer, the third barrier layer and the first barrier layer in turn on the base substrate;
wherein in a period of forming the second barrier layer, nitrogen gas and argon gas of a first predetermined proportion are introduced;
in a period of forming the aluminum layer or the aluminum alloy layer, argon gas is introduced;
in a period of forming the third barrier layer, nitrogen gas and argon gas of a third predetermined proportion are introduced; and
in a period of forming the first barrier layer, nitrogen gas and argon gas of a second predetermined proportion are introduced.

\* \* \* \* \*